(12) United States Patent
Han

(10) Patent No.: US 7,155,642 B2
(45) Date of Patent: Dec. 26, 2006

(54) INTERLEAVER FOR A TURBO ENCODER IN AN UMTS AND METHOD FOR PERFORMING INTERLEAVING

(75) Inventor: Sung-Chul Han, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 607 days.

(21) Appl. No.: 09/943,895

(22) Filed: Aug. 31, 2001

(65) Prior Publication Data

US 2002/0091900 A1 Jul. 11, 2002

(30) Foreign Application Priority Data

Sep. 29, 2000 (KR) ............... 2000-57330

(51) Int. Cl.
*G01F 11/00* (2006.01)
*G11C 29/00* (2006.01)

(52) U.S. Cl. ...................... 714/701; 714/702
(58) Field of Classification Search ................ 714/701, 714/702, 763, 791, 792; 711/200, 217, 218, 711/209
See application file for complete search history.

(56) References Cited

U.S. PATENT DOCUMENTS

| | | | |
|---|---|---|---|
| 6,289,486 B1 * | 9/2001 | Lee et al. ................... | 714/788 |
| 6,543,013 B1 * | 4/2003 | Li et al. ..................... | 714/701 |
| 6,553,516 B1 * | 4/2003 | Suda et al. ................. | 714/702 |
| 6,732,316 B1 * | 5/2004 | Tong et al. ................. | 714/756 |

FOREIGN PATENT DOCUMENTS

| EP | 0 660 558 | 12/1994 |
|---|---|---|
| JP | 2000-138596 | 5/2000 |
| JP | 2001-138596 | 5/2001 |
| JP | 2002-535867 | 10/2002 |
| WO | WO 00/42709 | 7/2000 |

OTHER PUBLICATIONS

Japanese Office Action dated Jun. 24, 2003 issued in a counterpart application, namely, Appln. No. 2001-298445.
Shibutani et al., "W-CDMA Mobile Radio Performances With Turbo Codes Using Prime Interleaver", Technical Report of IEICE, 1999.
"3rd Generation Partnership Project; Technical Specification Group Radio Access Network; Multiplexing and Channel Coding (FDD)", Jun. 2000, pp. 1-62.
Nortel Networks: "Prime Interleaver Complexity Analysis", TSG-RAN WG-1, Meeting #4, Yokohama, Japan, Apr. 18, 1999, pp. 1-9.
Lee et al., "Turbo MAP Decoder Design for IS-2000 System", 2000 IEEE, pp. 412-415.

* cited by examiner

*Primary Examiner*—Guy Lamarre
*Assistant Examiner*—John J. Tabone, Jr.
(74) *Attorney, Agent, or Firm*—The Farrell Law Firm

(57) ABSTRACT

An interleaver is disclosed for a turbo encoder in an UMTS. The interleaver includes a register for updating and registering a plurality of parameters for setting an operating condition of the interleaver; a controller for generating a control signal for controlling an operation of the system by receiving the operating condition from the register; an address calculator for generating a finally interleaved address using an inter-row permutation pattern T(j), an intra-row permutation pattern increment arrangement value incr(j) and an intra-row permutation basic sequence s(i), provided from the register according to the control signal generated by the controller; and a data storage for sequentially storing data input to the turbo encoder and outputting data corresponding to the address generated by the address calculator.

10 Claims, 3 Drawing Sheets

INTERLEAVER FOR A TURBO ENCODER IN AN UMTS AND METHOD FOR PERFORMING INTERLEAVING

PRIORITY

This application claims priority to an application entitled "Interleaver For a Turbo Encoder in an UMTS System and Method for Performing Interleaving" filed in the Korean Industrial Property Office on Sep. 29, 2000 and assigned Serial No. 2000-57330; the contents of which are hereby incorporated by reference.

BACKGROUND OF THE INVENTION

1. Field of the Invention

The present invention relates generally to a turbo encoder for a radio communication system, and in particular, to an interleaver for a turbo encoder in an UMTS (Universal Mobile Telecommunication System) and a method for performing interleaving.

2. Description of the Related Art

In general, a turbo encoder using a turbo code is typically used for a radio communication system such as ISDN (Integrated Services Digital Network), digital cellular, W-CDMA (Wideband Code Division Multiple Access) and IMT-2000 systems. The turbo encoder includes an interleaver, which improves a codeword distance characteristic by randomizing data input to the turbo encoder. A performance of the turbo encoder chiefly depends on the interleaver.

FIG. 1 illustrates a structure of a conventional turbo encoder designated generally by reference numeral 106. As illustrated, the turbo encoder 106 includes a first constituent encoder 102 for encoding input frame data dK into output data Y1K, an interleaver 100 for interleaving the input fame data dK, and a second constituent encoder 104 for encoding the interleaved data output from the interleaver 100 into output data Y2K. As a result, the turbo encoder 106 outputs data XK equivalent to the non-encoded input fame data dK, the encoded data Y1K and the interleaved encoded data Y2K. the interleaver 100 outputs data, which is equal in size to the input data frame dK, and permutes the sequence of the data bits input to the second constituent encoded 104 so as to reduce correlation among the data bits.

A detailed description of the interleaver 100 will now be given below. The interleaver 100 sequentially stores the input data in a memory with a matrix structure of rows and columns, and then initializes interleaving parameters determined according to the number of input data bits. That is, the interleaver 100 sets various parameters such as index of row number of rectangular matrix j and index of column number of rectangular matrix i and prime number p and primitive root μ for inter-row/intra-row permutation for interleaving the input data as well as the number R of the rows and the number C of the columns, to the values corresponding to the number K of the input data bits by consulting a table in the memory.

For example, if the number of the input data bits is K=40, then the parameters are determined as R=5, C=8, p=7 and μ=3. The interleaver 100 then arranges the input data in a 5×8 matrix of the memory as shown in Table 1 below.

TABLE 1

| 1 | 2 | 3 | 4 | 5 | 6 | 7 | 8 |
| 9 | 10 | 11 | 12 | 13 | 14 | 15 | 16 |
| 17 | 18 | 19 | 20 | 21 | 22 | 23 | 24 |
| 25 | 26 | 27 | 28 | 29 | 30 | 31 | 32 |
| 33 | 34 | 35 | 36 | 37 | 38 | 39 | 40 |

Subsequently, the interleaver 100 first performs interleaving on the rows of the input data, arranged as shown in Table 1. At this point, the interleaver 100 determines an iter-row permutation pattern T(j) to perform interleaving on the rows. The inter-row permutation pattern T(j) is a function for inter-row interleaving the input data, and is determined by Equation (1) below according to the number K of the input data bits.

$T(j)=\text{pat4}$ (for $40 \leq K \leq 159$)   Equation (1)

$T(j)=\text{pat3}$ (for $160 \leq K \leq 200$)

$T(j)=\text{pat1}$ (for $201 \leq K \leq 480$)

$T(j)=\text{pat3}$ (for $481 \leq K \leq 5530$)

$T(j)=\text{pat1}$ (for $531 \leq K \leq 2280$)

$T(j)=\text{pat2}$ (for $2281 \leq K \leq 2480$)

$T(j)=\text{pat1}$ (for $2481 \leq K \leq 3160$)

$T(j)=\text{pat2}$ (for $3161 \leq K \leq 3210$)

$T(j)=\text{pat1}$ (for $3211 \leq K \leq 5114$)

where pat1={19,9,14,4,0,2,5,7,12,18,10,8,13,17,3,1,16,6,15,11},
pat2={19,9,14,4,0,2,5,7,12,18,16,13,17,15,3,1,6,11,8,10},
pat3={9,8,7,6,5,4,3,2,1,0}, and
pat4={4,3,2,1,0}.

The interleaver 100 permutes the rows of the input data by coping a $T(j)^{th}$ row of the original matrix into a $j^{th}$ row of a new matrix according to the inter-row permutation pattern T(j). That is, since the number of the input data bits is K=40, the inter-row permutation pattern is determined as T(j)=pat4. Table 2 below shows a matrix of the input data which was subjected to inter-row permutation according to the selected permutation sequence. As shown in Table 2, the $4^{th}$ row's data of the original matrix is rearranged in the $0^{th}$ row of the new matrix; the $3^{rd}$ row's data of the original matrix is rearranged in the $1^{st}$ row of the new matrix; the $2^{nd}$ row's data of the original matrix is rearranged in the $2^{nd}$ row of the new matrix; the $1^{st}$ row's data of the original matrix is rearranged in the $3^{rd}$ row of the new matrix; and the $0^{th}$ row's data of the original matrix is rearranged in the $4^{th}$ row of the new matrix.

TABLE 2

| 33 | 34 | 35 | 36 | 37 | 38 | 39 | 40 |
| 25 | 26 | 27 | 28 | 29 | 30 | 31 | 32 |
| 17 | 18 | 19 | 20 | 21 | 22 | 23 | 24 |
| 9 | 10 | 11 | 12 | 13 | 14 | 15 | 16 |
| 1 | 2 | 3 | 4 | 5 | 6 | 7 | 8 |

Thereafter, the interleaver 100 sequentially calculates a minimum prime integer sequence q(j), a permuted prime integer sequence r(j), and intra-row permutation basic sequence s(i), which are permutation sequences for intra-row permutation, in accordance with Equation (2) below.

$$g.c.d\{q(j), p-1\} = 1, q(j) > 6, q(j) > q(j-1), q = 1, 2, \ldots, R-1, q(0) = 1 \text{ (where g.c.d is greatest common divisor)}$$  Equation 2

$$r[T(j)] = q(j), j = 0, 1, \ldots, R-1$$

$$s(i) = [\mu \times s(i-1)] \bmod p, i = 1, 2, \ldots, (p-2), s(0) = 1$$

Further, the interleaver 100 calculates a final intra-row permutation pattern $U^j(j)$ for the inter-row/intra-row permutation using the intra-row permutation basic sequence s(i), in accordance with Equation (3) below.

1. $U^j(i) = s\{[i \times r(j)] \bmod (p-1)\}, i = 0, 1, 2, \ldots, p-2, U(p-1) = 0$ (for C=p)  Equation (3)

2. $U^j(i) = s\{[i \times r(j)] \bmod (p-1)\}, i = 0, 1, 2, \ldots, p-2, U(p-1) = 0, U(p) = p$ (for C=p+1).

When K=C×R, $U^{R-1}(p)$ is exchanged with $U^{R-1}(0)$ after intra-row permutation.

3. $U^j(i) = s\{[i \times r(j)] \bmod (p-1)\} - 1, i = 0, 1, 2, \ldots, p-2$ (for C=p)

That is, for the respective columns, the final intra-row permutation pattern values $U^j(i)$ are calculated as shown in Equation(4) below.

$$U^0(i) = s(17i \bmod 6) = \{s(0), s(5), s(4), s(3), s(2), s(1), 0, 7\} = \{1, 5, 4, 6, 2, 3, 0, 7\}$$  Equation (4)

$$U^1(i) = s(13i \bmod 6) = \{s(0), s(1), s(2), s(3), s(4), s(5), 0, 7\} = \{1, 3, 2, 6, 4, 5, 0, 7\}$$

$$U^2(i) = s(11i \bmod 6) = \{s(0), s(5), s(4), s(3), s(2), s(1), 0, 7\} = \{1, 5, 4, 6, 2, 3, 0, 7\}$$

$$U^3(i) = s(7i \bmod 6) = \{s(0), s(1), s(2), s(3), s(4), s(5), 0, 7\} = \{1, 3, 2, 6, 4, 5, 0, 7\}$$

$$U^4(i) = s(i \bmod 6) = \{7, s(1), s(2), s(3), s(4), s(5), 0, s(0)\} = \{7, 3, 2, 6, 4, 5, 0, 1\}$$

Therefore, the interleaver 100 performs the final interleaving as shown in Table 3 below by intra-row permuting the data sequence which was subjected to inter-row permutation as shown in Table 2, according to the final intra-row permutation pattern $U^j(i)$ for the intra-row permutation.

TABLE 3

| 34 | 36 | 37 | 34 | 35 | 36 | 33 | 40 |
|----|----|----|----|----|----|----|----|
| 26 | 28 | 27 | 31 | 29 | 30 | 25 | 32 |
| 18 | 22 | 21 | 23 | 19 | 20 | 17 | 24 |
| 10 | 12 | 11 | 15 | 13 | 14 | 9  | 16 |
| 8  | 4  | 3  | 7  | 5  | 6  | 1  | 2  |

As described above, the interleaver 100 of the conventional turbo encoder 106 requires an additional temporary memory to intermediately (or temporarily) store the permuted data in the process of interleaving the input data, which can overload a microprocessor and/or a digital signal processor (DSP).

SUMMARY OF THE INVENTION

It is therefore, an object of the present invention to provide an interleaver for an UMTS turbo encoder, capable of preventing an overload on a microprocessor and/or a digital signal processor during interleaving, and a method for performing interleaving.

It is another object of the present invention to provide an interleaver and a method for performing interleaving, capable of calculating a deinterleaved final address without using an additional temporary memory to store intermediately (or temporarily) permuted data in the process of interleaving the input data.

To achieve the above and other objects, there is provided an interleaver for a turbo encoder in an UMTS. The interleaver includes a register for updating and registering a plurality of parameters for setting an operating condition of the interleaver; a controller for generating a control signal for controlling an operation of the system by receiving the operating condition from the register; an address calculator for generating a finally interleaved address using an inter-row permutation pattern T(j), an intra-row permutation pattern increment arrangement value incr(j) and an intra-row permutation basic sequence s(i), provided from the register according to the control signal generated by the controller; and a data storage for sequentially storing data input to the turbo encoder and outputting data corresponding to the address generated by the address calculator.

Preferably, the address calculator includes an intra-row permutation pattern generator for calculating an intra-row permutation pattern data sequence using the intra-row permutation pattern increment arrangement value incr(j) provided from the register according to the control signal generated by the controller; an intra-row permutation pattern storage arrangement part for storing intermediate data while the intra-row permutation pattern generator calculates the intra-row permutation pattern; and a final address generator for calculating an address of the finally interleaved data by taking the inter-row permutation pattern from the register and the intra-row permutation basic sequence corresponding to the intra-row permutation pattern value generated by the intra-row permutation pattern generator.

Preferably, the register updates and registers parameters used to calculate inter-row/intra-row permutation pattern of the input data to be interleaved, and provides the parameters to the intra-row permutation pattern generator so as to generate an intra-row permutation pattern for generating an interleaved final intra-row permutation pattern.

Preferably, the register updates and registers a parameter K indicating a number of input data bits, a parameter $\mu$ indicating a primitive root, a parameter p indicating a prime number, a parameter R indicating a number of rows of the input data, a parameter C indicating a number of columns of the input data and a parameter TypeD indicating an exceptional process request signal. These parameters are used to calculate the inter-row permutation pattern T(j), the intra-row permutation pattern increment arrangement value incr (j) and the intra-row permutation basic sequence s(i).

Preferably, the intra-row permutation pattern generator simplifies an operation by using an inter-row inverse permutation pattern TI(j) determined by inversing the inter-row permutation pattern T(j) in order to calculate a permuted prime integer sequence r(j) in a process of calculating the final intra-row permutation pattern $U^j(i)$.

Preferably, the intra-row permutation pattern generator includes a first adder for adding a previous intra-row permutation pattern read from an intra-row permutation pattern memory to the intra-row permutation pattern increment arrangement value incr(j), to thereby output a first add value; a second adder for adding the first add value output from the first adder to a prime number −(p−1), to thereby output a second add value; a first multiplexer for selectively outputting one of the first and second add values from the first and second adders; a sign detector connected to the second adder and the first multiplexer for providing a selection control signal to the first multiplexer so that the first multiplexer outputs the second add value as an address of the intra-row permutation basic sequence s(i) when the second add value has a positive value, and outputs the first add value as an address of the intra-row permutation basic sequence when the second add value has a negative value; and a second multiplexer for outputting a predetermined initial value during an initial operation of the intra-row permutation pattern generator, and then, providing the output of the first multiplexer as a read address of the intra-row permutation pattern storage arrangement part for the next intra-row permutation pattern.

Preferably, the increment arrangement value incr(j) is calculated in accordance with a following equation:

$$incr(j)=r\{TI(j)\} \bmod(p-1)$$

where incr(j): increment,

TI(j): inter-row inverse permutation pattern, p: prime number, and r(j): permutated prime integer sequence.

Preferably, the intra-row permutation pattern storage arrangement part sequentially stores a read address of one column output from the second multiplexer, and feeds back a previously stored read address to the first adder.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
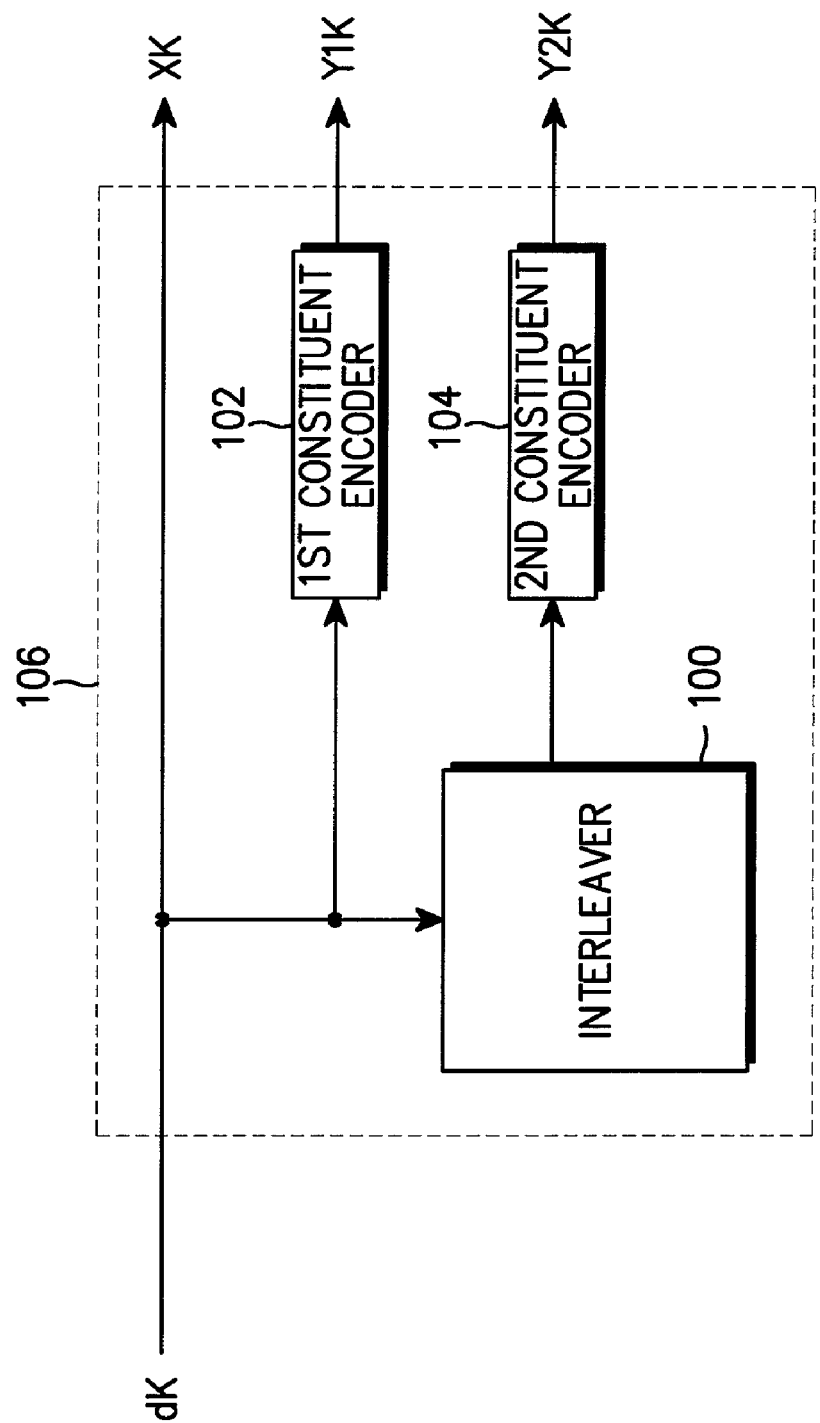
FIG. 1 is a bock diagram illustrating a prior art turbo encoder.
Figure 2:
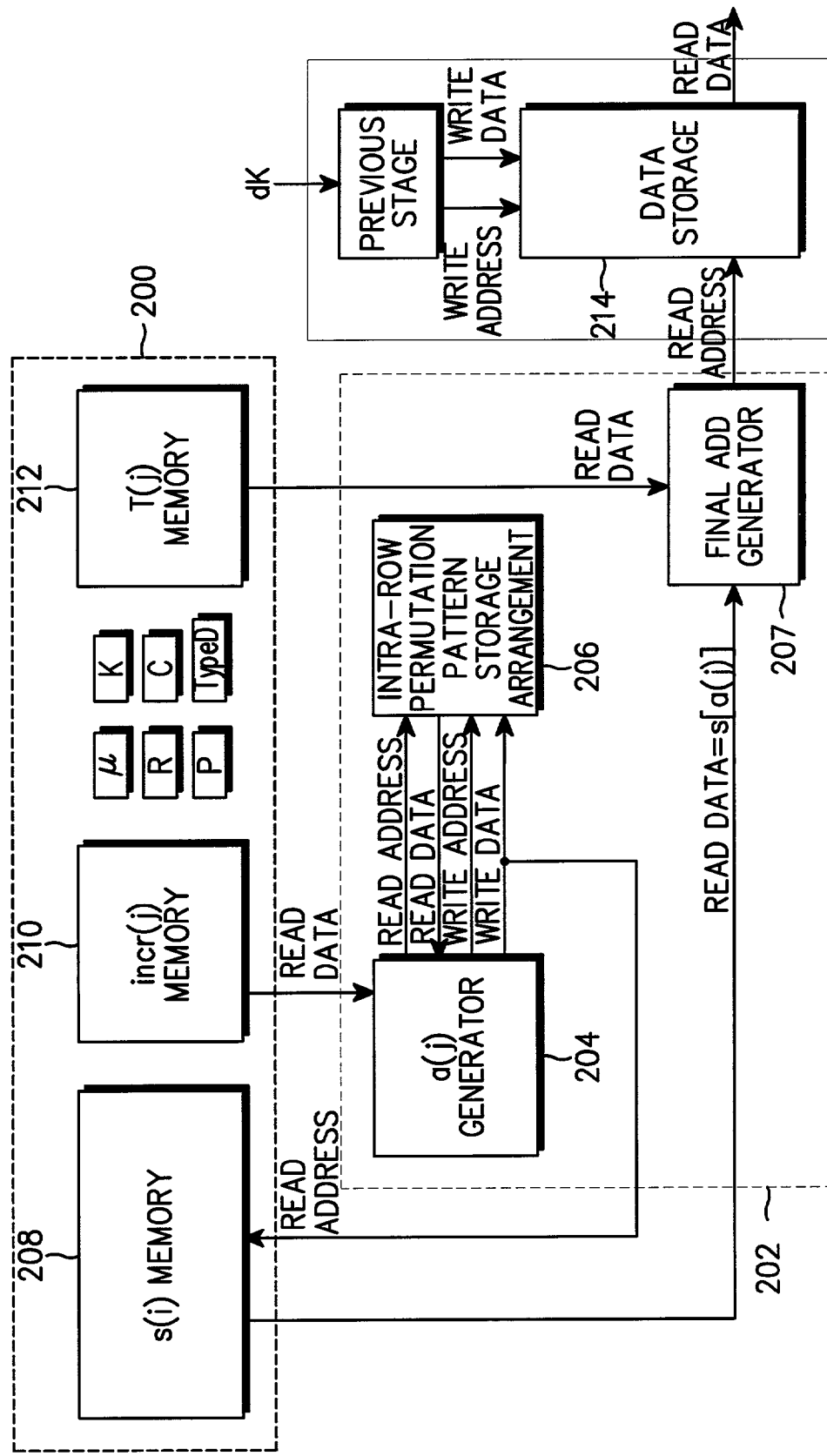
FIG. 2 is a block diagram illustrating an interleaver for a turbo encoder according to an embodiment of the present invention.

FIG. 2 illustrates a structure of an interleaver for a turbo encoder according to an embodiment of the present invention. Referring to FIG. 2, the number K of input data bits, and parameters R, C, p, μ and TypeD determined depending on the input data bit number K are stored in a register 200. The parameter TypeD is set to '1', when C=p+1 and K=C*R.

In addition, an inter-row permutation pattern T(j), an intra-row permutation basic sequence s(i), an intra-row permutation pattern increment arrangement value incr(j) are stored in an memory of the register 200. The inter-row permutation pattern T(j), the intra-row permutation basic sequence s(i) and the intra-row permutation pattern increment arrangement value incr(j) are provided with i and j values from a controller (not shown), and the corresponding values are provided to an address calculator 202. The inter-row permutation pattern T(j) is determined by Equation (1), the intra-row permutation basic sequence s(i) is determined by Equation (2), and the intra-row permutation pattern increment arrangement value incr(j) is determined by Equation (5) below.

$$incr(j)=r(j)\bmod(p-1), j=0,1,\ldots,R-1 \quad \text{Equation (5)}$$

In the embodiment of the present invention, an inter-row inverse permutation pattern TI(j) determined by inversing the inter-row permutation pattern T(j) is used rather than the inter-row permutation pattern T(j) in the process of calculating a permutated prime integer sequence r(j) used in Equation (5). In this manner, it is possible to reduce operations required to calculate the permutated prime integer sequence r(j) as shown in Equation (6) below.

$$r(j)=q[TI(j)], j=0,1,\ldots,R-1 \quad \text{Equation (6)}$$

Here, the minimum prime integer sequence q(j) is identical to that of Equation (2), and the inter-row inverse permutation pattern TI(j) is determined by Equation (7) below.

$$TI(j)=\text{pat8 (for } 40 \leq K \leq 159) \quad \text{Equation (7)}$$

$$TI(j)=\text{pat7 (for } 160 \leq K \leq 200)$$

$$TI(j)=\text{pat5 (for } 201 \leq K \leq 480)$$

$$TI(j)=\text{pat7 (for } 481 \leq K \leq 5530)$$

$$TI(j)=\text{pat5 (for } 531 \leq K \leq 2280)$$

$$TI(j)=\text{pat6 (for } 2281 \leq K \leq 2480)$$

$$TI(j)=\text{pat5 (for } 2481 \leq K \leq 3160)$$

$$TI(j)=\text{pat6 (for } 3161 \leq K \leq 3210)$$

$$TI(j)=\text{pat5 (for } 3211 \leq K \leq 5114)$$

where pat5={4,15,5,14,3,6,17,7,11,1,10,19,8,12,2,18,16,13,9,0}, pat6={4,15,5,14,3,6,16,7,18,1,19,17,8,11,2,13,10,12,9,0}, pat7={9,8,7,6,5,4,3,2,1,0}, and pat8={4,3,2,1,0}.

After completion of setting the register 200, the controller in a hardware part sequentially generates counter values i and j for controlling the address calculator 202. Here, the counter values i and j each start from '0', and the counter value i increases by 1 when the counter value j reaches a value 'R−1' by increasing one by one. The controller repeats the same operation until the counter values i and j reach 'C−1' and 'R−1', respectively.

Meanwhile, if an intra row permutation pattern $a^i(j)$ is defined as the expression [i×r(j)] mod (p−1), which is used as indices of the intra row permutation basic sequence s(i) in Equation (3), then the final intra row permutation pattern $U^j(i)$ can be represented by Equation(8).

$$a^i(j)=[i \times r(j)] \bmod(p-1) \quad \text{Equation (8)}$$

Therefore, $U^j(i)=s[a^i(j)], j=0,1,2,\ldots,R-1, i=0,1,2,\ldots,p-2$.

The present invention used the fact that an intra-row permutation pattern $a^i(j)$ of each row defined in Equation(8) is represented by a remainder determined by dividing by (p−1) the previous intra-row permutation pattern value $a^{i-1}(j)$). If the row number j is fixed and the value i is increased one by one starting from the initial value '0', the intra row permutation pattern $a^i(j)$ for $j^{th}$ row can be calculated with Equation (9) instead of using the expression in Equation(8). By determining the intra-row permutation pattern increment arrangement value incr(j) in advance, the intra-row permutation pattern $a^i(j)$ is generated during actual operation of the hardware part by performing only the addition and modulo operations rather than performing multiplication, using the intra-row permutation pattern increment corresponding to each row. This is shown in Equation (9) below.

$$a^i(j)=[a^{i-1}(j)+\text{incr}(j)] \bmod (p-1) \qquad \text{Equation (9)}$$

where $j=0,1,2,\ldots,R-1, i=1,2,\ldots,p-2, a^0(j)=0$.

That is, as shown in Equation (9), the intra-row permutation pattern $a^i(j)$ for each j can be calculated from a previous intra-row permutation pattern $a^{i-1}(j)$. Further, since i does not decrease during the interleaving process, it is not necessary to store the previous value after calculating the present value. Based on this calculation method, an intra-row permutation pattern [a(j)] generator 204 stores the final $a^i(j)$ value for each j in an intra-row permutation pattern storage arrangement part 206 whenever it generates an intra-row permutation pattern $a^{i-1}(j)$ for each i and j.

During an operation of the hardware part, the intra-row permutation pattern generator 204 generates an intra-row permutation pattern for each i and j provided from the controller. Since it is necessary to initialize the intra-row permutation pattern storage arrangement part 206 when i=0, the intra-row permutation pattern generator 204 outputs '0' as an intra-row permutation pattern $a^i(j)$ and stores the output value in the intra-row permutation pattern storage arrangement part 206. When $0<i \leq (p-2)$, the intra-row permutation pattern generator 204 reads a $j^{th}$ data bit from the intra-row permutation pattern a(j), adds it to an increment read from the intra-row permutation pattern increment arrangement value incr(j), and then generates a new intra-row permutation pattern by performing a modulo operation. The generated new intra-row permutation pattern is stored in a $j^{th}$ address of the intra-row permutation pattern storage arrangement part 206 for generation of the next intra-row permutation pattern.

The intra-row permutation pattern $a^i(j)$ generated by the intra-row permutation pattern generator 204 is provided as a read address to an intra-row permutation basic sequence [s(i)] memory 208 in the register 200, and an output s[a(j)] of the memory 208 is provided to a final address generator 207.

The final address generator 207 first calculates a final intra-row permutation pattern $U^j(i)$ by taking the corresponding value s[a(j)] of the intra-row permutation basic sequence according to the i and j values provided from the controller, and then calculates a finally interleaved address xaddr using the calculated value and the inter-row permutation pattern T(j) provided from the register 200. In addition, the final address generator 207 performs an exceptional process for TypeD=1. The calculation process of the final address generator 207 is shown in Equations (10) and (11) below.

$$U^j(i)=s[a(j)] \text{ (for } 0 \leq i \leq p-2) \qquad \text{Equation (10)}$$

$$U^j(i)=0 \text{ (for } i=p-1)$$

$$U^j(i)=p \text{ (for } i=p)$$

where $i=0,1,2,\ldots,C-1, j=0,1,2,\ldots,R-1$.

However, the following exceptional process is performed for TypeD=1.

$$U^j(i)=p \text{ (for } i=0 \text{ and } j=R-1)$$

$$U^j(i)=1 \text{ (for } i=p \text{ and } j=R-1)$$

$$\text{xaddr}=C*T(j)+U^j(i) \qquad \text{Equation (11)}$$

A data storage 214 reads data corresponding to the finally interleaved address xaddr generated from the final address generator 207 and outputs the read data.

Figure 3:
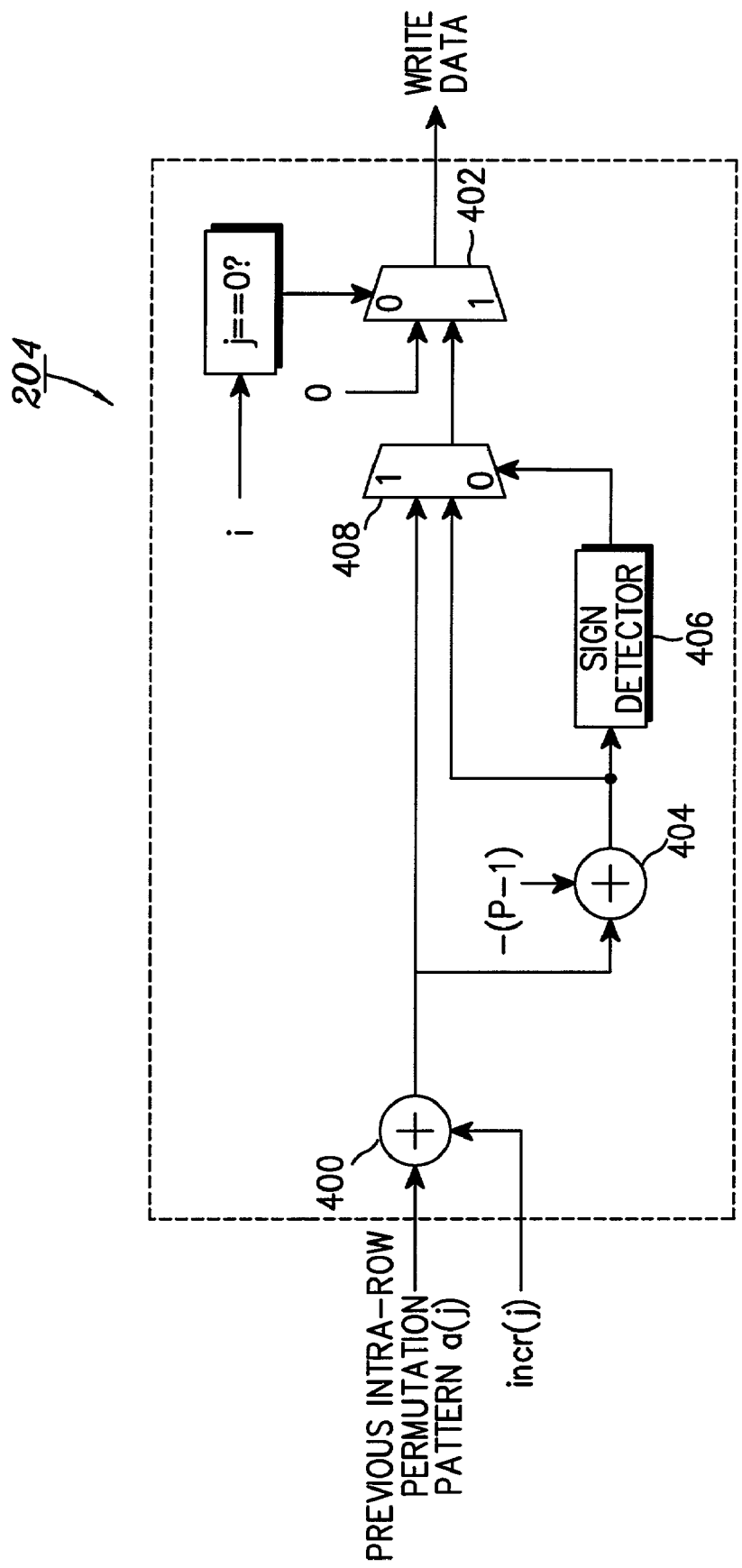
FIG. 3 is a detailed block diagram illustrating the intra-row permutation pattern generator of FIG. 2.

FIG. 3 illustrates a detailed structure of the intra-row permutation pattern generator 204. When the parameter i for the intra-row permutation pattern a(j) is '0' (i.e., i=0), a second multiplexer 402 selects '0' as an initial value of the intra-row permutation pattern a(j), and the selected value is provided as an address of the intra-row permutation basic sequence s(i) in the register 200 and at the same time, is stored in a $j^{th}$ address of the intra-row permutation pattern storage arrangement part 206.

When the parameter i is not '0' (i.e., i≠0), data corresponding to the $j^{th}$ address of the intra-row permutation pattern storage arrangement part 206 is fed back to a first adder 400 as a previous parameter data value, which corresponds to the previously stored intra-row permutation pattern $a^{i-1}$(j). A value stored in the $j^{th}$ address of the intra-row permutation pattern increment arrangement value incr(j) is provided from the register 200 to another input end of the first adder 400. Thus, the first adder 400 adds the previous intra-row permutation pattern a(j) to the increment value incr(j), and a first add value output from the first adder 400 is provided to a second adder 404, which adds the first add value to a prime number [−(p−1)] as shown in Equation (5).

The added value is provided in common to a first multiplexer 408 and a sign detector 406. That is, the second adder 404 outputs a remainder [{a(j)+incr(j)}−(p−1)] determined by dividing the first add value [a(j)+incr(j)] by the prime number (p−1). This is because as shown in Equation (9), when the sum of the previous intra-row permutation pattern a(j) and the increment value incr(j) is larger than the prime number (p−1), a value determined by subtracting (p−1) from the first add value becomes equivalent to the remainder in the process of performing a modulo operation using the prime number (p−1).

A second add value [{a(j)+incr(j)}−(p−1)] output from the second adder 404 is provided in common to the MSB (Most Significant Bit) sign detector 406 and the first multiplexer 408. The sign detector 406 then detects only the MSB bit of the second add value output from the second adder 404 and provides the detected MSB bit to the first multiplexer 408 as a selection control signal. The first multiplexer 408 selectively outputs the first add value a(j)+incr(j) output from the first adder 400 and the second add value [{a(j)+incr(j)}−(p−1)] output from the second adder 404 according to the selection control signal output from the sign detector 406.

If a sign detected by the sign detector 406 is '0', it means that the first add value is equal to or larger than (p−1), so that (p−1) should be subtracted from the first add value to obtain a result value of the modulo operation. Otherwise, if the sign is '1', it means that the first add value is smaller than (p−1), so that the first add value becomes equal to a result value of the modulo operation. Accordingly, the second multiplexer 402 selects a correct modulo operation result for the first and second add values output from the first multiplexer 408 after the initial value i=0; provides the selected value as an address of the intra-row permutation basic sequence s(i) in the register 200; and, at the same time, stores the selected value in the $j^{th}$ address of the intra-row permutation pattern storage arrangement part 206.

A description will now be made of an operation of the intra-row permutation pattern generator 204 with reference to Equation(4) used to calculate the final intra-row permutation pattern $U^j(i)$ of the input data. When j=0 and i=0, an output address value i, i.e., the intra-row permutation pattern a(j) for the intra-row permutation basic sequence s(i) is set to '0'. Then, the initial value '0' of the intra-row permutation pattern a(j) is stored in the intra-row permutation pattern storage arrangement part 206 and, at the same time, is provided as an address of the intra-row permutation basic sequence s(i).

That is, when i increases by one for the same j value (='0'), the previous intra-row permutation pattern value '0' stored in the intra-row permutation pattern storage arrangement part 206 is provided to the first adder 400, which adds the previous intra-row permutation pattern '0' to an increment incr(j) value '5'. As a result, the first add value '5' is provided in common to one input end of the first multiplexer 408 and the second adder 404.

The second adder 404 then adds the first add value '5' to the prime number –(p–1) '–6' and outputs a value '–1' to the sign detector 406. Since the second add value has a negative value, the sign detector 406 generates a selection control signal '1' so that the first multiplexer 408 should select the first add value output from the first adder 400. Accordingly, the first multiplexer 408 outputs the first add value '5', and this value is selected through the second multiplexer 402 as the next intra-row permutation pattern a(j) and then stored in the intra-row permutation pattern storage arrangement part 206. That is, in this method, the address value i of the intra-row permutation basic sequence s(i) is calculated without using complicated Equation (2), thus contributing to the simple circuit structure.

The register 200 stores the parameter µ indicating a primitive root; the parameter K indicating the number of the input data bits; the parameter R indicating the number of rows of the input data; the parameter C indicating the number of the columns of the input data; the parameter p indicating a prime number; and the parameter TypeD indicating an exceptional process request signal as well as the increment incr(j) according to the input data bit number K provided from the controller. In addition, the register 200 previously stores the inter-row permutation pattern T(j) of the input data determined according to the input data bit number K.

A description will now be made of an operation of the final address generator 207 using the intra-row permutation pattern generator 204, the intra-row permutation basic sequence s(i) and the inter-row permutation pattern [T(j)] memory 212. The intra-row permutation pattern output from the intra-row permutation pattern generator 204 is provided to the intra-row permutation basic sequence memory 208 in the register 200 as a read address. Accordingly, the intra-row permutation basic sequence memory 208 provides the final address generator 207 with the value s[a(j)] designated by the read address provided from the intra-row permutation pattern generator 204.

Since the address value in the intra-row permutation basic sequence memory 208, designated by the read address, is equivalent to the final intra-row permutation pattern value U'(i) of the input data, the final address generator 207 receives the value s[a(j)] read from the intra-row permutation basic sequence s(i) and the inter-row permutation pattern read from the inter-row permutation pattern memory 212, and provides the received values to the data storage 214 as a read address for reading interleaved output data. As a result, the input data stored in the read address area in the data storage 214 is read and output as interleaved output data.

To sum up, the present invention does not store again the input data rearranged during intra-row or inter-row permutation of the input data in a separate memory. Instead, the embodiment of the present invention operates a final intra-row or inter-row permuted read address from the data storage in which data is sequentially stored, and outputs the data corresponding to the read address, thus making it possible to implement the same function as the conventional interleaver which sequentially reads data from the memory in which the interleaved data is separately stored.

Accordingly, the interleaver for the turbo encoder according to the present invention can prevent a waste of the memory and has a simple structure. In addition, the novel interleaver can reduce a load on the turbo encoder.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An interleaver for a turbo encoder in a Universal Mobile Telecommunications System (UMTS), comprising:
   a register for updating and registering a plurality of parameters for setting an operating condition of the interleaver;
   an address calculator for generating a finally interleaved address using an inter-row permutation pattern T(j), an intra-row permutation pattern increment arrangement value incr(j) and an intra-row permutation basic sequence s(i) provided from the register, comprising:
   an intra-row permutation pattern generator for calculating an intra-row permutation pattern value using the intra-row permutation pattern increment arrangement value incr(j), comprising:
   a first adder for adding a previous intra-row permutation pattern read from an intra-row permutation pattern memory of the register with the intra-row permutation pattern increment arrangement value incr(j) to thereby output a first add value;
   a second adder for adding the first add value output from the first adder to a prime number –(p–1) to thereby output a second add value;
   a first multiplexer for selectively outputting one of the first and second add values from the first and second adders;
   a sign detector connected to the second adder and the first multiplexer for providing a selection control signal to the first multiplexer so that the first multiplexer outputs the second add value as an address of the intra-row permutation basic sequence s(i) when the second add value has a positive value, and outputs the first add value as an address of the intra-row permutation basic sequence when the second add value has a negative value; and
   a second multiplexer for outputting a predetermined initial value during an initial operation of the intra-row permutation pattern generator, and then providing the output of the first multiplexer as a read address of the intra-row permutation pattern storage arrangement device for a succeeding intra-row permutation pattern;
   an intra-row permutation pattern storage arrangement device for storing intermediate data while the intra-row permutation pattern generator calculates the intra-row permutation pattern; and
   a final address generator for calculating an address of finally interleaved data using the inter-row permutation pattern T(j) from the register and the intra-row permutation basic sequence s(i) corresponding to the intra-row permutation pattern value generated by the intra-row permutation pattern generator; and a data storage device for storing data input to the turbo encoder and outputting data corresponding to the address generated by the address calculator.

2. The interleaver as claimed in claim 1, wherein the register updates and registers parameters used to calculate inter-row/intra-row permutation pattern of the input data to be interleaved, and provides the parameters to an intra-row permutation pattern generator of the address calculator to generate an intra-row permutation pattern for generating an interleaved final intra-row permutation pattern.

3. The interleaver as claimed in claim 1, wherein the register updates and registers a parameter K indicating a number of input data bits; a parameter μ indicating a primitive root; a parameter p indicating a prime number; a parameter R indicating a number of rows of the input data; a parameter C indicating a number of columns of the input data; and a parameter TypeD indicating an exceptional process request signal, wherein the parameters are used to calculate the inter-row permutation pattern T(j); the intra-row permutation pattern increment arrangement value incr (j); and the intra-row permutation basic sequence s(i).

4. The interleaver as claimed in claim 1, wherein the intra-row permutation pattern generator uses an inter-row inverse permutation pattern TI(j) determined by inversing the inter-row permutation pattern T(j) to calculate a permuted prime integer sequence r(j) for calculating a final intra-row permutation pattern $U^j(i)$.

5. The interleaver as claimed in claim 1, wherein the increment arrangement value incr(j) is calculated in accordance with a following equation:

$$\text{incr}(j) = r\{TI(j)\} \bmod (p-1)$$

where incr(j): increment,
TI(j): inter-row inverse permutation pattern,
p: prime number, and
r(j): permuted prime integer sequence.

6. The interleaver as claimed in claim 1, wherein the intra-row permutation pattern storage arrangement device sequentially stores a read address of one column output from the second multiplexer, and feeds back a previously stored read address to the first adder.

7. The interleaver as claimed in claim 1, wherein the data is input sequentially to the data storage device.

8. A method for performing interleaving in an interleaver for a turbo encoder, comprising the steps of:

permuting an inter-row address of input data according to an inter-row permutation pattern T(j) determined depending on a number of input data bits;

calculating an increment incr(j) for generating an intra-row permutation pattern a(j) using the permuted inter-row address;

calculating an intra-row permutation pattern using the increment incr(j) and a previous intra-row permutation pattern, comprising:

adding a previous intra-row permutation pattern read from an intra-row permutation pattern memory with the intra-row permutation pattern increment arrangement value incr(j) to generate a first add value;

adding the first add value to a prime number −(p−1) to generate a second add value;

outputting one of the first and second add values; and outputting a predetermined initial value during an initial calculation of the intra-row permutation pattern, and providing the output as a read address of the intra-row permutation pattern for a succeeding intra-row permutation pattern; and calculating a read address of an intra-row permutation basic sequence s(i) for permuting an intra-row address of the input data using the intra-row permutation pattern, wherein the second add value is output as an address of the intra-row permutation basic sequence s(i) when the second add value has a positive value, and the first add value is output as an address of the intra-row permutation basic sequence when the second add value has a negative value.

9. The method as claimed in claim 8, further comprising the steps of:

calculating a final intra-row permutation pattern;

calculating a finally interleaved address using the final intra-row permutation pattern and the inter-row permutation pattern T(j); and sequentially outputting data corresponding to the finally interleaved address thereby interleaving the input data.

10. The method as claimed in claim 8, further comprising the step of sequentially storing the data input to the turbo encoder in a data memory.

* * * * *